(12) United States Patent
Naohara et al.

(10) Patent No.: US 11,474,150 B2
(45) Date of Patent: Oct. 18, 2022

(54) DATA PROCESSING METHOD, DATA PROCESSING DEVICE, AND NON-TRANSITORY COMPUTER-READABLE RECORDING MEDIUM

(71) Applicant: SCREEN Holdings Co., Ltd., Kyoto (JP)

(72) Inventors: Hideji Naohara, Kyoto (JP); Mayumi Yamamoto, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 250 days.

(21) Appl. No.: 16/554,536

(22) Filed: Aug. 28, 2019

(65) Prior Publication Data
US 2020/0096566 A1    Mar. 26, 2020

(30) Foreign Application Priority Data

Sep. 20, 2018    (JP) .............................. JP2018-176259

(51) Int. Cl.
*G01R 31/317*    (2006.01)
*G06F 17/18*    (2006.01)
*G01R 31/28*    (2006.01)

(52) U.S. Cl.
CPC ... *G01R 31/31725* (2013.01); *G01R 31/2831* (2013.01); *G06F 17/18* (2013.01)

(58) Field of Classification Search
CPC .......... G01R 31/31725; G01R 31/2831; G06F 17/18
See application file for complete search history.

(56) References Cited

U.S. PATENT DOCUMENTS

| | | |
|---|---|---|
| 6,405,157 B1 | 6/2002 | Fujii et al. |
| 6,797,526 B2 | 9/2004 | Tanaka et al. |
| 9,065,728 B2 | 6/2015 | Shimokawa et al. |
| 9,168,630 B2 | 10/2015 | Lee et al. |
| 9,335,277 B2 | 5/2016 | Nakagaki et al. |
| 9,581,996 B2 * | 2/2017 | Asai ................... G05B 23/0235 |
| 2003/0154052 A1 | 8/2003 | Samata et al. |
| 2007/0105244 A1 | 5/2007 | Okita |
| 2008/0269917 A1 | 10/2008 | Chand et al. |

(Continued)

FOREIGN PATENT DOCUMENTS

| | | |
|---|---|---|
| CA | 2458427 | 8/2004 |
| CA | 2930158 | 11/2016 |

(Continued)

*Primary Examiner* — Bryan Bui
(74) *Attorney, Agent, or Firm* — JCIPRNET

(57) ABSTRACT

A data processing method that processes a plurality of unit processing data (each unit processing data include plural types of time-series data) includes an evaluation value distribution utilization step, in which processing that uses evaluation value distributions showing degrees of each value of evaluation values obtained by evaluating each time-series datum is carried out (for example, a step in which each time-series datum is compared with reference data and scoring that quantifies results obtained thereby as the evaluation values is carried out, and a step in which judgment of abnormality degrees is carried out using the evaluation value distributions based on results of the scoring); and an evaluation value distribution update step, in which the evaluation value distributions are updated.

14 Claims, 15 Drawing Sheets

(56) References Cited

U.S. PATENT DOCUMENTS

| | | | |
|---|---|---|---|
| 2009/0125276 A1 | 5/2009 | Koizumi | |
| 2010/0055001 A1 | 3/2010 | Ikeda et al. | |
| 2013/0110259 A1 | 5/2013 | Brown et al. | |
| 2013/0280989 A1 | 10/2013 | Lee et al. | |
| 2013/0304419 A1 | 11/2013 | Nakamura et al. | |
| 2017/0017229 A1 | 1/2017 | Keitel | |
| 2017/0116319 A1 | 4/2017 | Zhou | |
| 2017/0336775 A1 | 11/2017 | Tokorozuki et al. | |
| 2018/0068906 A1 | 3/2018 | Ogi et al. | |
| 2018/0314914 A1 | 11/2018 | Kuriyama et al. | |
| 2020/0097381 A1* | 3/2020 | Naohara | G06F 17/18 |

FOREIGN PATENT DOCUMENTS

| | | |
|---|---|---|
| CN | 103081407 | 5/2013 |
| CN | 103632032 | 3/2014 |
| CN | 106126385 | 11/2016 |
| CN | 106959668 | 7/2017 |
| CN | 107256003 | 10/2017 |
| EP | 1906283 | 4/2008 |
| EP | 1796136 | 9/2015 |
| JP | H10163080 | 6/1998 |
| JP | 2000035817 | 2/2000 |
| JP | 2000252179 | 9/2000 |
| JP | 2003077780 | 3/2003 |
| JP | 2004186445 | 7/2004 |
| JP | 2006146459 | 6/2006 |
| JP | 2006332213 | 12/2006 |
| JP | 2008226006 | 9/2008 |
| JP | 4158384 | 10/2008 |
| JP | 2009098797 | 5/2009 |
| JP | 2010282541 | 12/2010 |
| JP | 2010283000 | 12/2010 |
| JP | 2012151216 | 8/2012 |
| JP | 2013061853 | 4/2013 |
| JP | 2013205894 | 10/2013 |
| JP | 2015032666 | 2/2015 |
| JP | 5849167 | 1/2016 |
| JP | 2016136563 | 7/2016 |
| JP | 2017083985 | 5/2017 |
| JP | 2017112212 | 6/2017 |
| JP | 2017211713 | 11/2017 |
| JP | 2018041217 | 3/2018 |
| JP | 2018055294 | 4/2018 |
| JP | 2018120533 | 8/2018 |
| SG | 188751 | 4/2013 |
| TW | 201403275 | 1/2014 |
| WO | 2007052699 | 5/2007 |
| WO | 2013121493 | 8/2013 |
| WO | 2016206647 | 12/2016 |
| WO | 2017122292 | 7/2017 |

* cited by examiner

DATA PROCESSING METHOD, DATA PROCESSING DEVICE, AND NON-TRANSITORY COMPUTER-READABLE RECORDING MEDIUM

CROSS REFERENCE TO RELATED APPLICATIONS

This application claims the priority benefit of Japanese Patent Application No. 2018-176259, filed on Sep. 20, 2018. The entirety of the above-mentioned patent application is hereby incorporated by reference herein and made a part of this specification.

BACKGROUND OF THE DISCLOSURE

Technical Field

The disclosure relates to a digital data processing, in particular, to a method for processing time-series data.

Related Art

As a method for detecting abnormalities of machines or devices, the following method is known in which physical quantities (for example, length, angle, time, speed, force, pressure, voltage, current, temperature, flow rate and the like) showing an operating state of the machine or the device are measured using a sensor or the like and time-series data obtained by arranging measurement results in an order of generation is analysed. When the machine or the device carries out the same operation under the same condition, the time-series data change similarly if there is no abnormality. Therefore, places where abnormalities occur and causes of the abnormalities can be specified by comparing a plurality of time-series data changing similarly with each other to detect abnormal time-series data and analysing the abnormal time-series data. In addition, recently, improvements of data processing ability of computers are remarkable. Therefore, there are many cases in which required results are obtained in a practical time even if a data amount is enormous. Given this situation, analysis of time series data also becomes popular.

For example, in the field of manufacturing of a semiconductor substrate, the analysis of time-series data also becomes popular. In a manufacturing process of the semiconductor substrate (referred to as "substrate" hereinafter), a series of processing is performed by a substrate processing device. The substrate processing device includes a plurality of processing units for carrying out specific processing of the series of processing on the substrate. Each processing unit processes the substrate according to a predetermined procedure (referred to as "recipe"). At this time, time-series data are obtained based on measurement results of each processing unit. The processing unit in which an abnormality occurs or a cause of the abnormality can be specified by analyzing the obtained time-series data. Besides, the term "recipe" refers to not only the procedures carried out on the substrate, but also preprocessing carried out before the processing of the substrate, or the processing for carrying out maintenance and management of the state of the processing unit or carrying out various measurements relating to the processing units while the processing to the substrate is not carried out by the processing units. However, in the present specification, attention is paid to the processing carried out on the substrates. Furthermore, the disclosure which is related to calculation of abnormality degrees of time-series data obtained by the manufacturing of the substrate is disclosed in Japanese Laid-Open No. 2017-83985.

Generally, in the manufacturing process of a substrate, an enormous number of time-series data relating to parameters (various physical quantities) are obtained by implementation of recipes. The time-series data are data obtained by measuring the various physical quantities (for example, flow rate or temperature of processing fluid supplied from a nozzle, humidity in a chamber, internal pressure of the chamber, exhaust pressure of the chamber, and the like) using a sensor or the like when the recipes are implemented and arranging measurement results in time series. In addition, data obtained by applying analysis to an image taken by a camera are also the time series data. Then, judgment on whether each time-series datum is abnormal is carried out by comparing data values of the time-series data with threshold values, or by comparing values calculated according to a given calculation rule from the data values with the threshold values. Furthermore, a threshold value is set for each parameter.

However, since the threshold values that are set are not necessarily suitable values, accuracy of the abnormality judgment is not good. That is, according to the conventional method, the abnormalities of the time-series data cannot be detected with high accuracy. In addition, even if attention is paid to one certain recipe, contents of the obtained time series data tend to change with passage of time. Therefore, if such passage of time is not taken into consideration in the abnormality judgment, the abnormalities are not detected with sufficient accuracy.

Therefore, the disclosure provides a data processing method which can take passage of time into consideration to carry out an abnormality detection that uses time-series data with sufficient accuracy.

SUMMARY

According to one embodiment of the disclosure, a data processing method is provided, in which a plurality of types of time-series data obtained by unit processing is taken as unit processing data and a plurality of unit processing data is processed. The method including: an evaluation value distribution utilization step, in which processing that uses evaluation value distributions showing degrees of each value of evaluation values obtained by evaluating each time-series datum is carried out; and an evaluation value distribution update step, in which the evaluation value distributions are updated.

According to such a configuration, the processing that uses the evaluation value distributions showing distributions of the evaluation values obtained by evaluating each time-series datum is carried out. For example, when new time-series data are obtained, abnormality judgment of the time-series data can be carried out. When the evaluation value distributions are used for the abnormality judgment, update of the evaluation value distributions is carried out. Therefore, at the time of the abnormality judgment, for example a recent trend of the time series data can be taken into consideration. Based on the above, the abnormality detection that uses the time-series data can be carried out with sufficient accuracy taking passage of time into consideration.

According to another embodiment of the disclosure, a data processing device is provided, which takes a plurality of types of time-series data obtained by unit processing as unit processing data and processes a plurality of unit processing data. The data processing device includes an evaluation value distribution utilization part, which carries out processing that uses evaluation value distributions showing degrees of each value of evaluation values obtained by evaluating each time-series datum; and an evaluation value distribution update part, which updates the evaluation value distributions.

According to another embodiment of the disclosure, a non-transitory computer-readable recording medium is provided, in which a data processing program is stored to make a computer, which is included in a data processing device which takes a plurality of types of time-series data obtained by unit processing as unit processing data and processes a plurality of unit processing data, to implement an evaluation value distribution utilization step, in which processing that uses evaluation value distributions showing degrees of each value of evaluation values obtained by evaluating each time-series datum is carried out; and an evaluation value distribution update step, in which the evaluation value distributions are updated.

DESCRIPTION OF THE EMBODIMENTS

In the following, one embodiment of the disclosure is described with reference to attached drawings.

1. Overall Configuration

Figure 1:
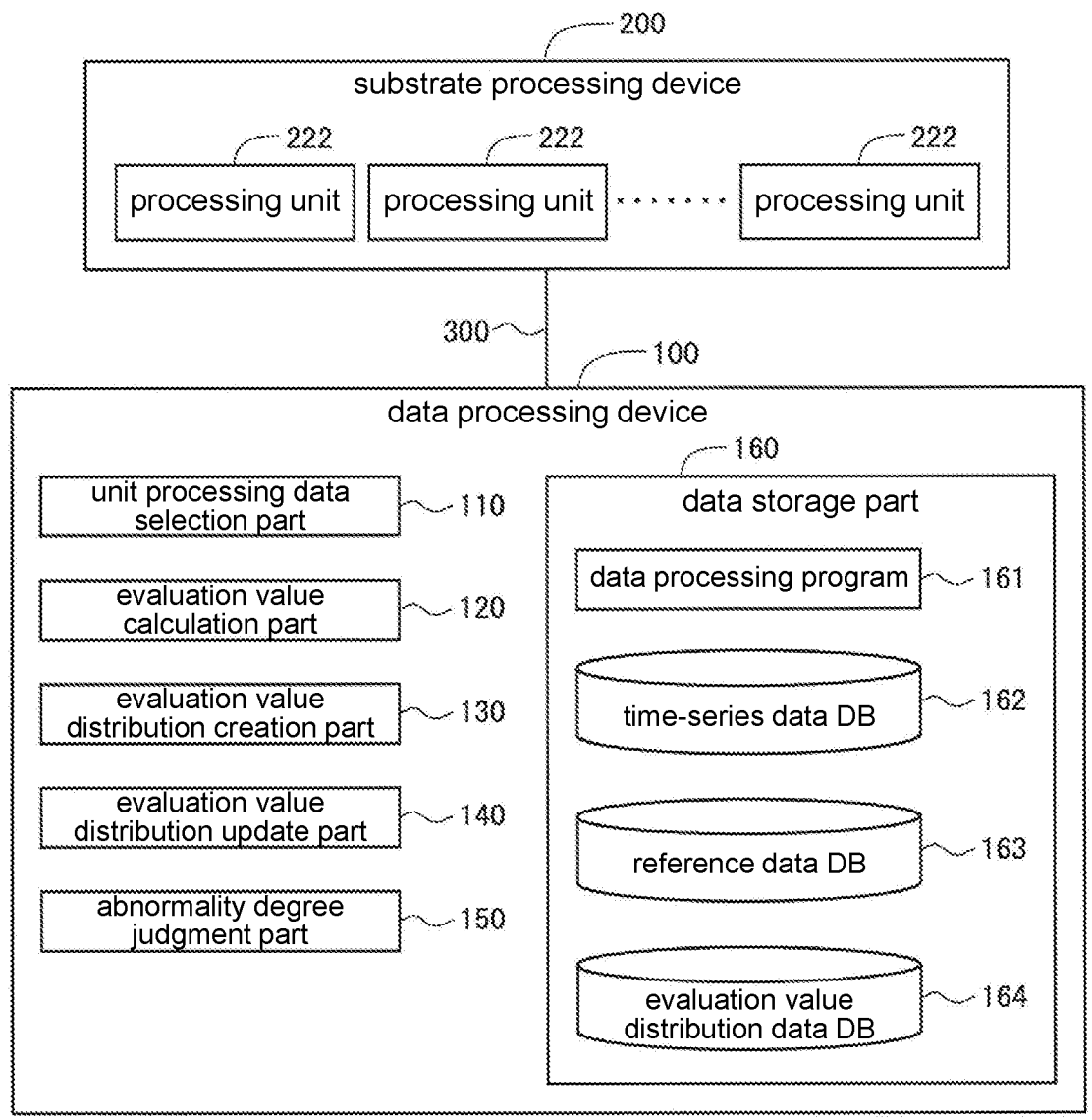
FIG. 1 is a block diagram showing an overall configuration of a data processing system (a data processing system for a substrate processing device) according to one embodiment of the disclosure.

FIG. 1 is a block diagram showing an overall configuration of a data processing system (a data processing system for a substrate processing device) according to one embodiment of the disclosure. The data processing system is configured by a data processing device 100 and a substrate processing device 200. The data processing device 100 and the substrate processing device 200 are connected to each other by a communication line 300.

The data processing device 100 functionally has a unit processing data selection part 110, an evaluation value calculation part 120, an evaluation value distribution creation part 130, an evaluation value distribution update part 140, an abnormality degree judgment part 150 and a data storage part 160. The unit processing data selection part 110 selects two or more unit processing data from a plurality of unit processing data described later which is already accumulated. The evaluation value calculation part 120 carries out calculation of evaluation values for judgments of abnormality degrees of time-series data obtained in substrate processing. For example, the evaluation value calculation part 120 calculates the evaluation values of each time-series datum included in the unit processing data selected by the unit processing data selection part 110. The evaluation value distribution creation part 130 creates evaluation value distributions described later based on the evaluation values (the evaluation value of each time-series datum) calculated by the evaluation value calculation part 120. The evaluation value distribution update part 140 carries out update of the evaluation value distributions. The abnormality degree judgment part 150 judges, under the condition that the evaluation value distributions already exist, abnormality degrees of time-series data newly obtained by implementing the recipes by the substrate processing device 200 based on the evaluation values of the time-series data and the evaluation value distributions. An evaluation value distribution utilization part is achieved by the evaluation value calculation part 120 and the abnormality degree judgment part 150. Furthermore, in the embodiment, it is assumed that as a result of the substrate processing, a smaller value of the evaluation values is better.

In the data storage part 160, a data processing program 161 for implementing various processing in the embodiment is held. Besides, the data storage part 160 includes a time-series data DB 162 for storing the time-series data sent from the substrate processing device 200, a reference data DB 163 for storing reference data, and an evaluation value distribution data DB 164 for storing evaluation value distribution data. The reference data and the evaluation value distribution data are described later. Furthermore, "DB" is short for "data base".

The substrate processing device 200 includes a plurality of processing units 222. In each processing unit 222, a plurality of physical quantities showing an operating state of the concerned processing unit 222 is measured. In this way, a plurality of time-series data (more specifically, time-series data of a plurality of parameters) is obtained. The time-series data obtained by the processing in each processing unit 222 are sent to the data processing device 100 from the substrate processing device 200 and stored in the time-series data DB 162 as described above.

Figure 2:
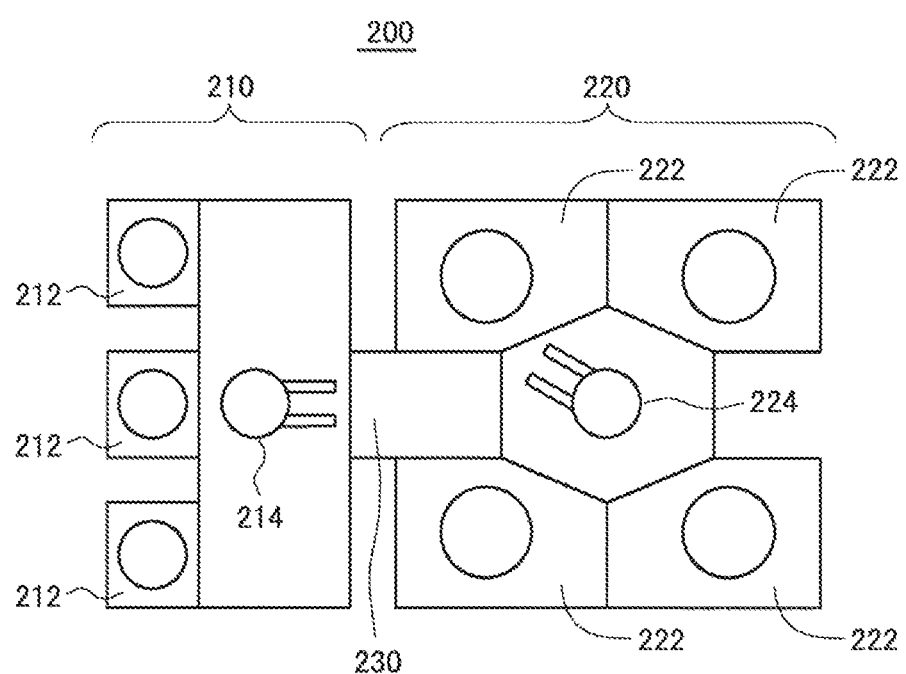
FIG. 2 is a diagram showing a schematic configuration of the substrate processing device in the above embodiment.

FIG. 2 is a diagram showing a schematic configuration of the substrate processing device 200. The substrate processing device 200 includes an indexer part 210 and a processing part 220. The indexer part 210 and the processing part 220 are controlled by a control part (not shown in the diagrams) inside the substrate processing device 200.

The indexer part 210 includes a plurality of substrate container holding parts 212 where substrate containers (cassettes) capable of containing plural pieces of substrates are placed, and an indexer robot 214 that takes the substrates out from the substrate containers and carries the substrates into the substrate containers. The processing part 220 includes a plurality of processing units 222 that uses processing solution to carry out the processing such as cleaning of the substrates or the like, and a substrate conveyance robot 224 that carries the substrates to the processing units 222 and takes the substrates out from the processing units 222. The number of the processing units 222 is for example 12. In this case, for example, a tower structure in which three processing units 222 are stacked is arranged, as shown in FIG. 2, in four places around the substrate conveyance robot 224. In each processing unit 222, a chamber which is a space for carrying out the processing to the substrates is arranged, and the processing solution is supplied to the substrates within the chamber. Furthermore, each processing unit 222 includes one chamber. That is, the processing units 222 and the chambers are in a one to one correspondence.

When the processing to the substrates is carried out, the indexer robot 214 takes out the substrate which is a processing target from the substrate containers placed on the substrate container holding parts 212, and delivers the substrate to the substrate conveyance robot 224 via a substrate delivery part 230. The substrate conveyance robot 224 carries the substrate received from the indexer robot 214 to a target processing unit 222. When the processing to the substrate ends, the substrate conveyance robot 224 takes out the substrate from the target processing unit 222 and delivers the substrate to the indexer robot 214 via the substrate delivery part 230. The indexer robot 214 carries the substrate received from the substrate conveyance robot 224 to a target substrate container.

In the data processing system, each time the recipes are implemented in order to detect abnormalities of machines related to the processing in each processing unit 222 or abnormalities of the processing carried out in each processing unit 222, and the like, time-series data are obtained. The time-series data obtained in the embodiment are data obtained by measuring various physical quantities (for example, flow rate of a nozzle, internal pressure of the chambers, exhaust pressure of the chambers, and the like) using a sensor or the like when the recipes are implemented and arranging measurement results in time series. The various physical quantities are handled as values of respectively corresponding parameters. Furthermore, one parameter corresponds to one type of physical quantity.

Figure 3:
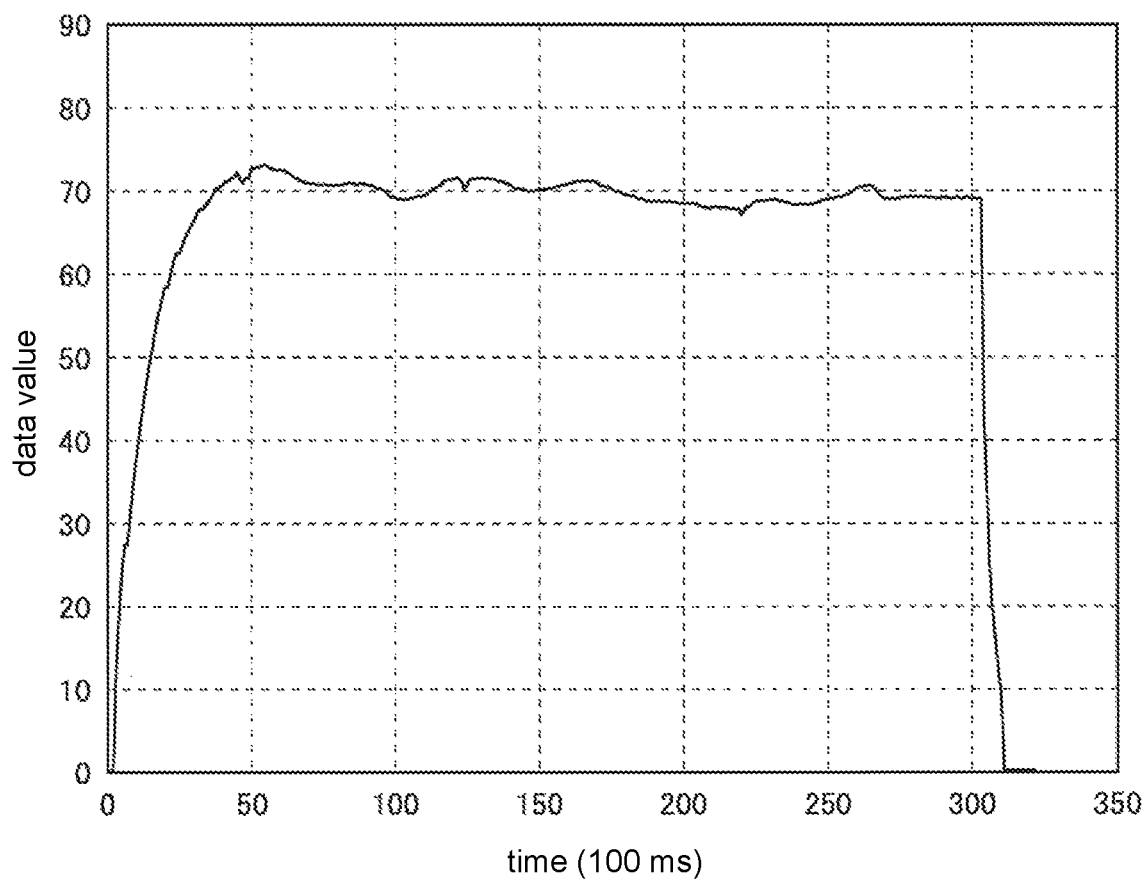
FIG. 3 is a diagram in which one time-series datum is graphed and shown in the above embodiment.
Figure 4:
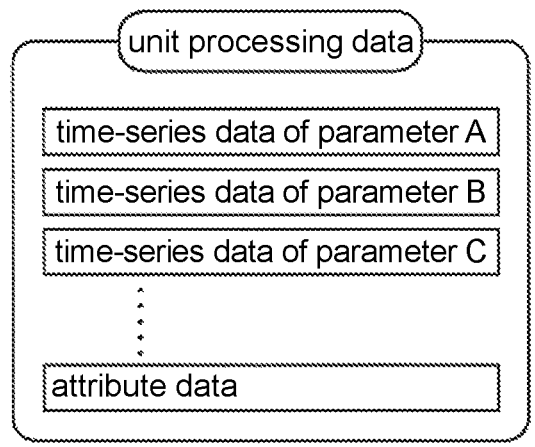
FIG. 4 is a diagram for illustrating unit processing data in the above embodiment.

FIG. 3 a diagram in which one certain time-series datum is graphed and shown. The time-series datum is a datum of certain physical quantity and obtained by the processing to one piece of substrate in the chamber within one processing unit 222 when one recipe is implemented. Furthermore, the time-series datum is a datum configured by a plurality of discrete values, and in FIG. 3, a straight line is made between two datum values adjacent in terms of time. Meanwhile, when one recipe is implemented, the time-series data of various physical quantities are obtained in each processing unit 222 in which the recipes are implemented. Therefore, in the following, the processing carried out to one piece of substrate in the chamber within one processing unit 222 when one recipe is implemented is called "unit processing", and a group of time-series data obtained by the unit processing is called "unit processing data". In one unit processing data, as schematically shown in FIG. 4, the time-series data of a plurality of parameters and attribute data consisting of data of a plurality of items (for example, start time of the processing, end time of the processing and the like) and the like for specifying the unit processing data are included. Furthermore, relating to FIG. 4, a "parameter A", a "parameter B", and a "parameter C" correspond to mutually different types of physical quantities.

In order to detect the abnormalities of the machines or the processing, the unit processing data obtained by implementation of the recipes should be compared with unit processing data having ideal data values as processing results. More specifically, the plurality of time-series data included in the unit processing data obtained by the implementation of the recipes should be respectively compared with a plurality of time-series data included in the unit processing data having the ideal data values as the processing results. Therefore, in the embodiment, relating to each recipe, the unit processing data (the unit processing data consisting of the plurality of time-series data to be respectively compared with the plurality of time-series data included in the unit processing data which are the evaluation targets) to be compared with the unit processing data which are evaluation targets is determined as reference data (data which are reference at the time of calculating the evaluation values). The reference data are stored in the above-described reference data DB 163 (see FIG. 1). Furthermore, relating to each recipe, the time-series data included in different unit processing data may be adopted as reference data for each parameter. That is, when attention is paid to the parameters corresponding to a certain recipe, the time-series data handled as the reference data for a certain parameter and the time-series data handled as the reference data for other parameters may be the time-series data included in mutually different unit processing data.

Figure 5:
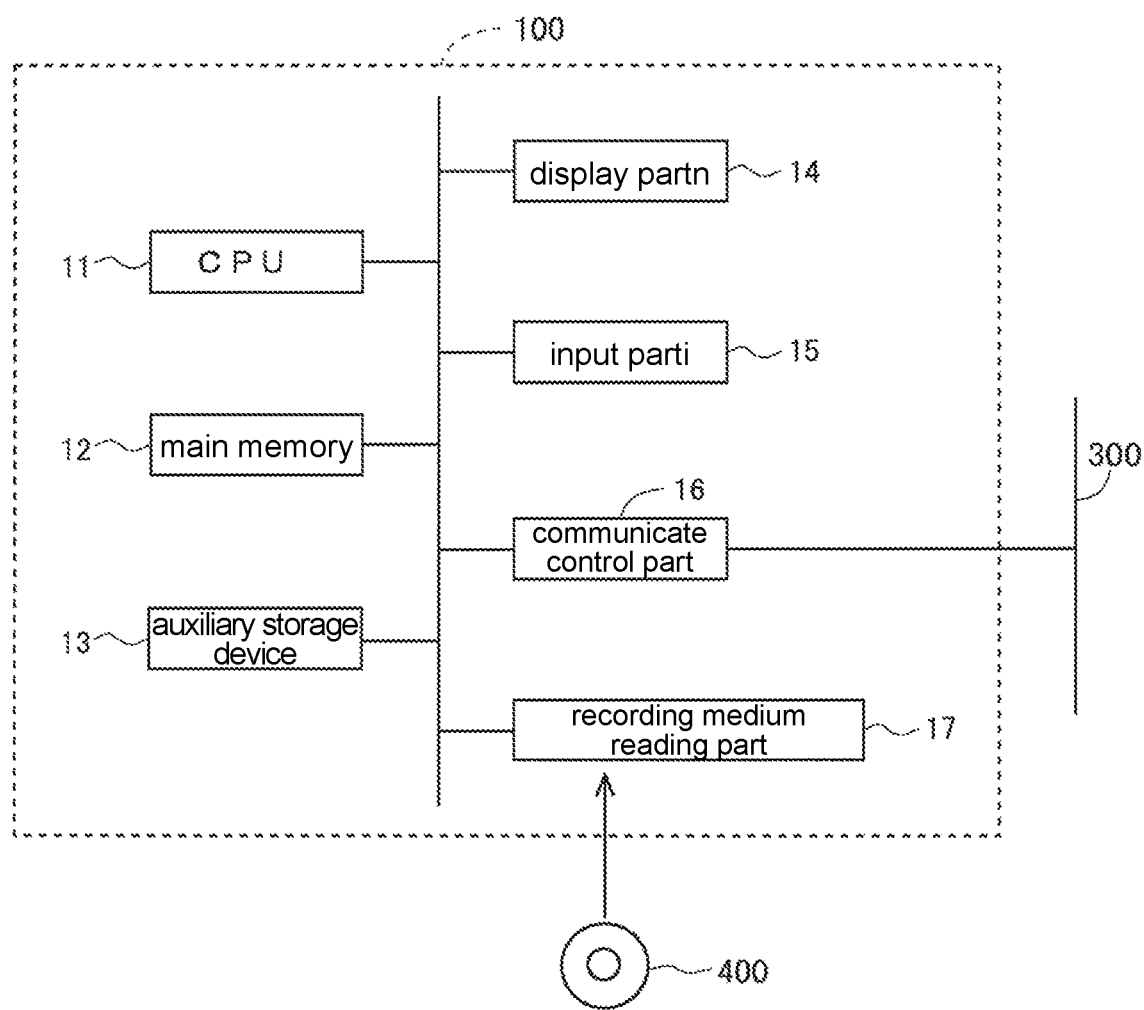
FIG. 5 is a block diagram showing a hardware configuration of the data processing device in the above embodiment.

Here, with reference to FIG. 5, a hardware configuration of the data processing device 100 is described. The data processing device 100 includes a CPU 11, a main memory 12, an auxiliary storage device 13, a display part 14, an input part 15, a communication control part 16 and a recording medium reading part 17. The CPU 11 carries out various arithmetic processing or the like according to given instructions. The main memory 12 temporarily stores programs being implemented or data. The auxiliary storage device 13 stores various program and various data which should be held even if electric power source is off. The data storage part 160 described above is achieved by the auxiliary storage device 13. The display part 14 displays, for example, various screens for an operator to carry out works. For example, a liquid crystal display is used for the display part 14. The input part 15 is, for example, a mouse, a keyboard or the like, and accepts input from outside by the operator. The communication control part 16 controls data transmission and reception. The recording medium reading part 17 is an interface circuit of a recording medium 400 recording the programs and the like. For example, a non-transitory recording medium such as a CD-ROM or a DVD-ROM is used for the recording medium 400.

When the data processing device 100 is started, a data processing program 161 (see FIG. 1) held in the auxiliary storage device 13 (the data storage part 160) is read into the main memory 12, and the CPU 11 implements the data processing program 161 read into the main memory 12. In this way, a function of carrying out various data processing is provided by the data processing device 100. Furthermore, the data processing program 161 is provided, for example, in a form of being recorded in the recording medium 400 such as a CD-ROM or a DVD-ROM or in a form of download via the communication line 300.

2. Evaluation of Substrate Processing

<2.1 Evaluation Value Distribution>

Figure 6:
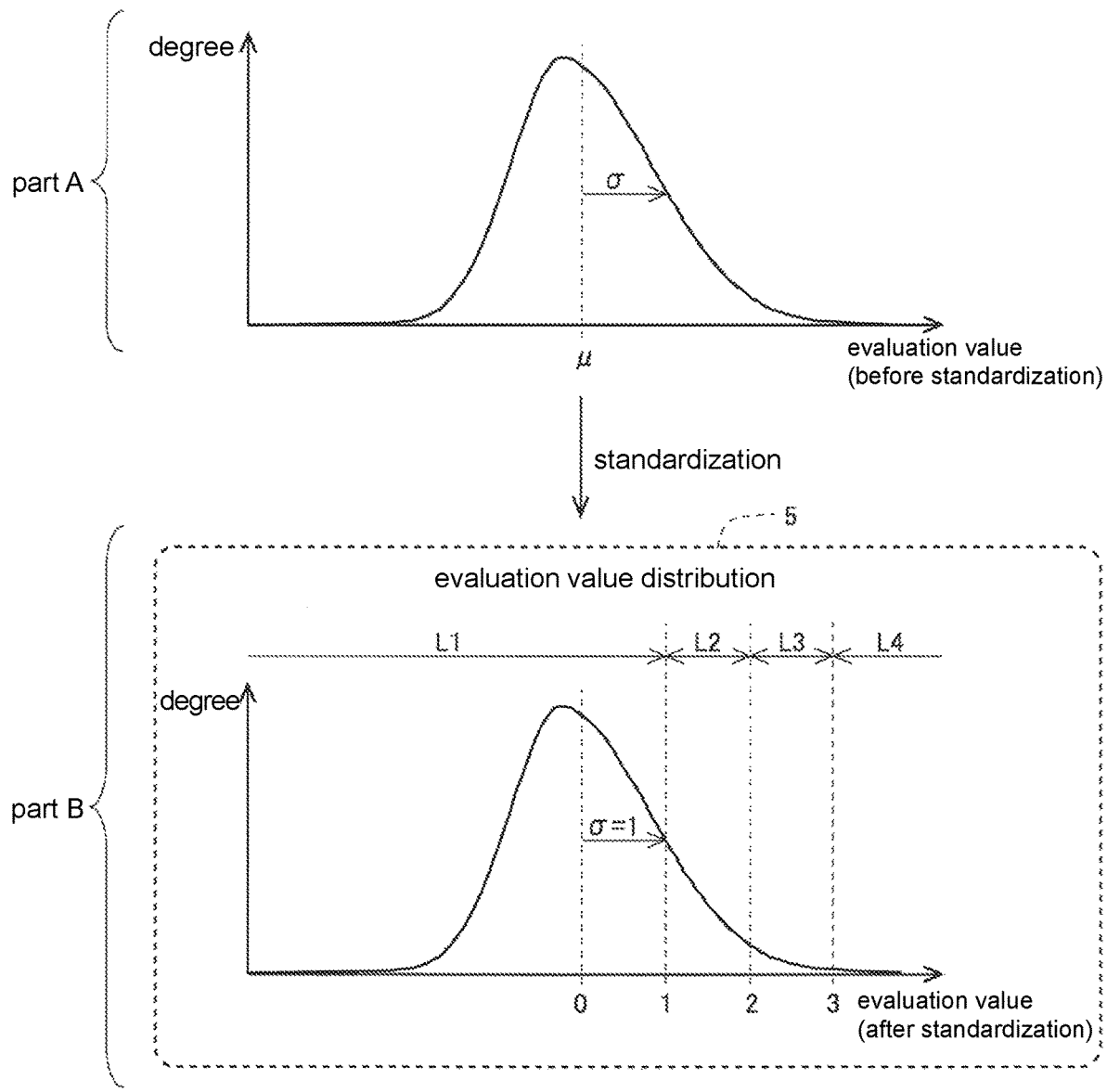
FIG. 6 is a diagram for illustrating evaluation value distributions in the above embodiment.

In the embodiment, in order to carry out abnormality judgment of each time-series datum, the evaluation value distributions showing degrees of each value of the evaluation values obtained by the evaluation value calculation part 120 are used. The evaluation value distributions are described specifically with reference to FIG. 6.

The evaluation value distributions are prepared for each parameter (that is, each type of the time-series data). When attention is paid to one certain parameter, a distribution showing the degrees of each evaluation value of the time-series data is, for example, as shown by part A of FIG. 6. As for part A of FIG. 6, $\mu$ represents an average value of evaluation values that are generation source of the distribution, and $\sigma$ represents a standard deviation of the evaluation values that are generation source of the distribution. Here, a distribution (a distribution in which the average value is 0 and a variance or a standard deviation is 1) as shown in part B of FIG. 6 can be created as an evaluation value distribution 5 by standardizing each of the evaluation values that are generation source of the distribution. Furthermore, if the evaluation values before the standardization are set as Sold, and the evaluation values after the standardization are set as Snew, the standardization is carried out by the following equation (1).

$$Snew = \frac{Sold - \mu}{\sigma} \quad (1)$$

If time-series data are newly generated by the performance of the recipes under a condition that the evaluation value distribution 5 as described above is prepared, the evaluation values of the time-series data are obtained. Then, the standardization based on the above equation (1) is carried out with respect to the obtained evaluation values using the average value $\mu$ and the standard deviation $\sigma$ at the time of creating the evaluation value distribution 5. Abnormality degrees of the time-series data are determined based on the evaluation values obtained by the standardization.

As for determination of the abnormality degrees, in the embodiment, a range of the evaluation values after the standardization is divided into four zones. That is, the abnormality degrees of each time-series datum are judged at four levels. Specifically, as shown in part B of FIG. 6, if the evaluation values (after the standardization) are less than 1, the abnormality degrees are judged as level 1 (L1); if the evaluation values are more than 1 and less than 2, the abnormality degrees are judged as level 2 (L2); if the evaluation values are more than 2 and less than 3, the abnormality degrees are judged as level 3 (L3); and if the evaluation values are more than 3, the abnormality degrees are judged as level 4 (L4).

Meanwhile, the division of the evaluation values after the standardization into four zones is carried out based on standard deviations. That is, threshold values between the zones are automatically determined. Therefore, different from the conventional situation, complicated work in which a user sets the threshold values in order to carry out the abnormality judgment of the time-series data is not required.

<2.2 Overall Processing Flow>

Figure 7:
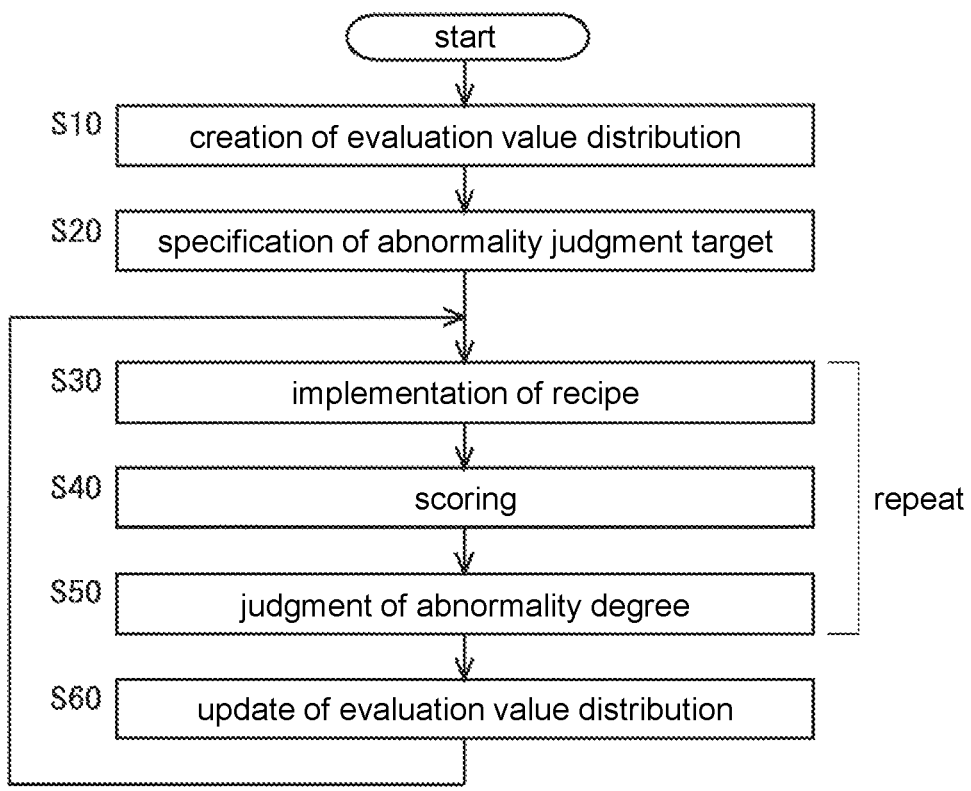
FIG. 7 is a flow chart showing an outline of an overall processing procedure of an abnormality detection that uses time-series data in the above embodiment.

FIG. 7 is a flow chart showing an outline of an overall processing procedure of an abnormality detection that uses the time-series data. Furthermore, it is assumed that a certain number of time-series data have already been accumulated before the processing starts.

At first, in order to realize the abnormality detection (the abnormality judgment of each time-series datum) that uses the time-series data, the creation of the evaluation value distribution 5 described above is carried out (step S10). In the embodiment, the evaluation value distribution 5 common to all the processing units 222 is created for each parameter. However, the evaluation value distribution 5 of each parameter may also be created for each processing unit 222. A specific procedure of the creation of the evaluation value distribution 5 is described later.

Figure 8:
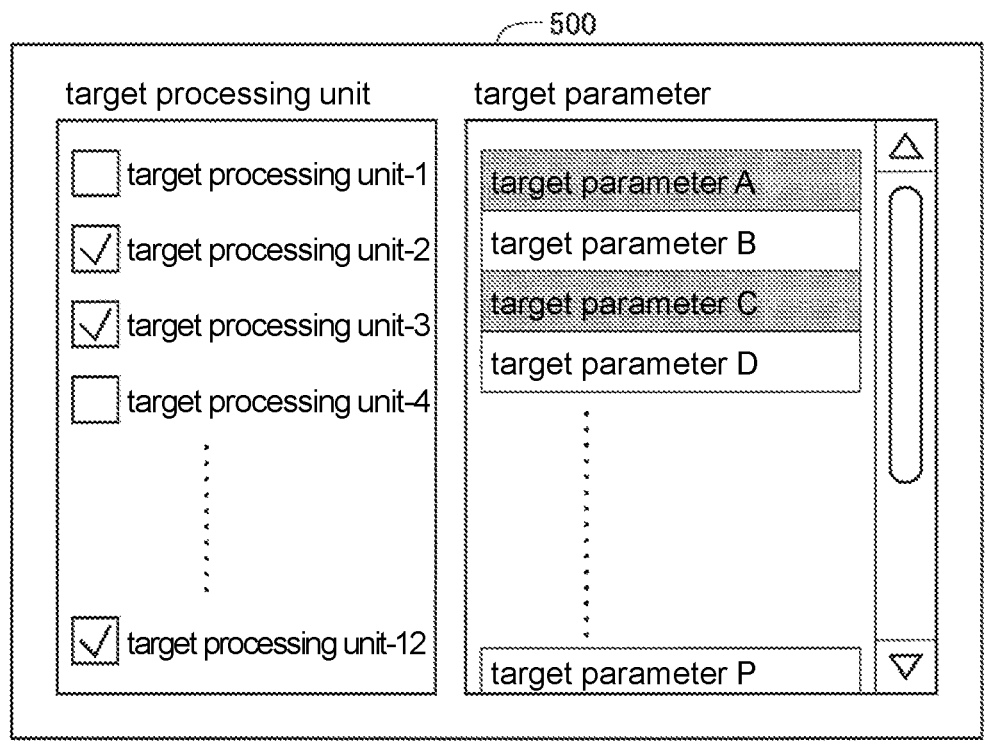
FIG. 8 is a diagram showing one example of an abnormality judgment target setting screen in the above embodiment.

Next, the processing units (the chambers) and the parameters which are the targets of the abnormality judgment are specified by the user (step S20). At this time, in the display part 14 of the data processing device 100, for example, an abnormality judgment target setting screen 500 (in FIG. 8, only one part of the actually displayed screen is shown; the same applies to FIG. 11, FIG. 12, and FIG. 13) as shown in FIG. 8 is displayed, and the user specifies the processing units and the parameters which are the targets of the abnormality judgment. In the example shown in FIG. 8, the processing units for which check boxes become selected states and the parameters which are in selected states within list boxes are specified as the targets of the abnormality judgment. Furthermore, in step S10, the evaluation value distributions 5 of all the parameter are created using the time-series data obtained in the processing in all the processing units 222, but only the time-series data of the parameters specified in step S20 among the time-series data obtained by the processing in the processing units specified in step S20 are targets to which the abnormality judgment is actually carried out.

Figure 9:
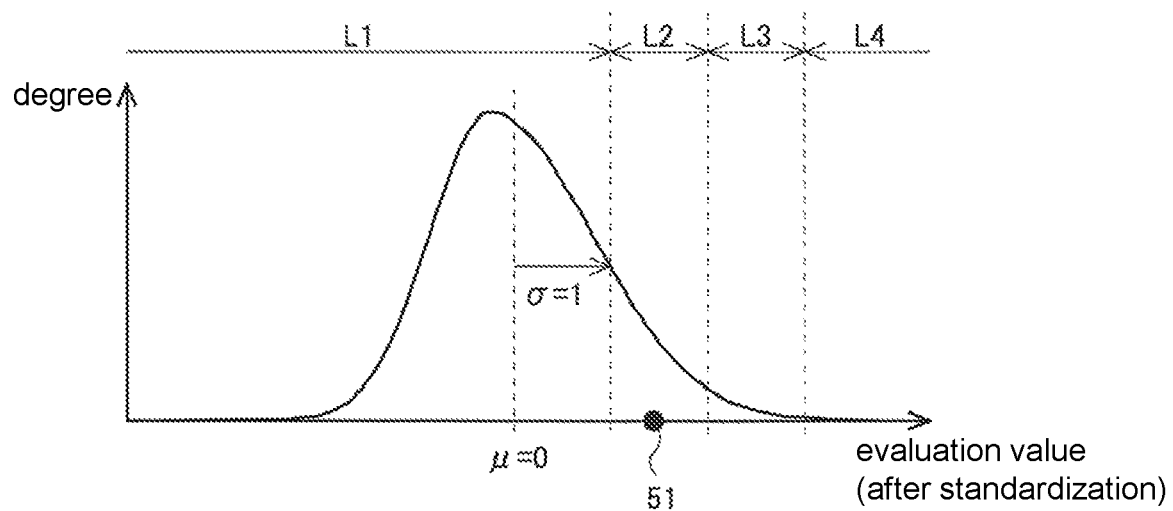
FIG. 9 is a diagram for illustrating judgment of abnormality degrees in the above embodiment.

Then, if the recipes are implemented by the substrate processing device 200 (step S30), scoring of the time-series data which are the abnormality judgment targets among the time-series data obtained by the implementation of the recipes is carried out (step S40). Furthermore, the scoring is the processing in which each time-series datum is compared with the reference data and results obtained thereby are quantified as the evaluation values. After the scoring ends, judgment of the abnormality degree is carried out using corresponding evaluation value distribution 5 for each time-series datum (step S50). In step S50, at first, the evaluation values obtained in step S40 are standardized. When the standardization of the evaluation values is carried out by the above equation (1), the average value μ and the standard deviation σ obtained at the time of the creation of the evaluation value distribution 5 is used as the average value μ and the standard deviation σ in the above equation (1). Then, the abnormality degrees are determined based on positions of the evaluation values after the standardization on the evaluation value distribution 5. For example, if an evaluation value after the standardization is a value in the position denoted by symbol 51 in FIG. 9, the abnormality degree of the time-series datum is judged as "level 2".

In the embodiment, the processing of step S30-step S50 is repeated until there is a change in contents of any one of the recipes. That is, the judgment of abnormality degrees when a certain recipe is implemented is carried out using the same evaluation value distribution 5 until there is a change in the contents of the recipe. If there is a change in the contents of any one of the recipes, update of the evaluation value distributions 5 is carried out (step S60). According to the embodiment, because the update of the evaluation value distribution is carried out in this way, for example, the abnormality detection that uses the time-series data can be carried out while considering recent trends. Furthermore, the update of the evaluation value distributions 5 is specifically described later. After the update of the evaluation value distributions 5, the processing returns to step S30.

Furthermore, in the embodiment, an evaluation value distribution utilization step is achieved by step S40 and step S50, and an evaluation value distribution update step is achieved by step S60.

3. Creation Method of Evaluation Value Distributions

Figure 10:
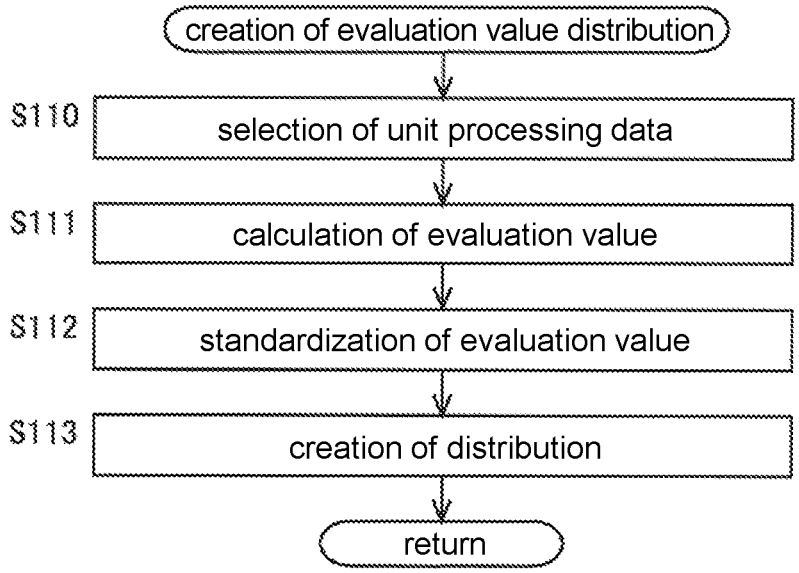
FIG. 10 is a flow chart showing a specific procedure of creation of the evaluation value distributions in the above embodiment.
Figure 11:
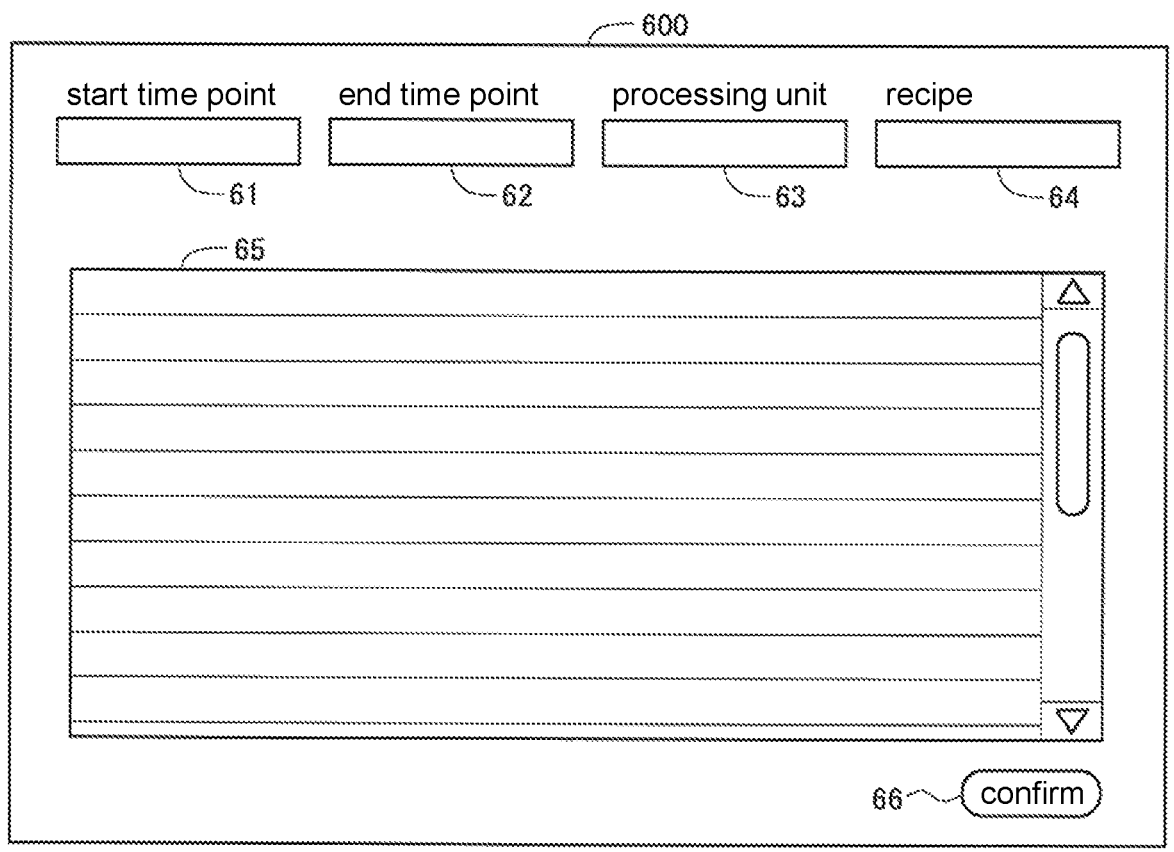
FIG. 11 is a diagram showing one example of a unit processing data selection screen in the above embodiment.

A specific procedure of the creation of the evaluation value distributions 5 in the embodiment (step S10 of FIG. 7) is described with reference to FIG. 10. At first, more than two unit processing data which are creation sources of the evaluation value distributions 5 are selected by the user (step S110). In step S110, in the display part 14 of the data processing device 100, for example, a unit processing data selection screen 600 as shown in FIG. 11 is displayed. In the unit processing data selection screen 600, a start time point input box 61, an end time point input box 62, a processing unit specification box 63, a recipe specification box 64, an extraction data display region 65, and a confirmation button 66 are included. The start time point input box 61 and the end time point input box 62 are list boxes in which date and time can be specified, and the processing unit specification box 63 and the recipe specification box 64 are list boxes in which one or more items can be selected from a plurality of items. The user specifies periods by the start time point input box 61 and the end time point input box 62, specifies the processing units by the processing unit specification box 63, and specifies the recipes by the recipe specification box 64. In this way, a list of unit processing data satisfying the specified conditions is displayed in the extraction data display region 65. The user presses the confirmation button 66 in a state that one part of or all of the unit processing data displayed in the extraction data display region 65 are selected. In this way, the unit processing data which are the creation sources of the evaluation value distributions 5 are confirmed. Furthermore, not all of the periods, the processing units, and the recipes are required to be specified, and at least one of the periods, the processing units, and the recipes may be specified.

Next, the evaluation values are calculated for each time-series datum included in the unit processing data selected in step S110 (referred to as "selected unit processing data" hereinafter) (step S111). In the embodiment, the reference data are held in the reference data DB 163 in advance. That is, the reference data which are to be compared with each time-series datum included in the selected unit processing data are held in the reference data DB 163. Therefore, in step S111, each time-series datum included in the selected unit processing data is compared with the reference data held in the reference data DB 163 (see FIG. 1), and the evaluation values of each time-series datum are calculated.

Then, the evaluation values calculated in step S111 are standardized (step S112). As described above, the evaluation values are standardized using the above equation (1). Meanwhile, because the evaluation value distributions 5 are created for each parameter, the average value μ and the standard deviation σ in the above equation (1) are obtained for each parameter.

At last, for each parameter (that is, each type of the time-series data), the evaluation value distribution 5 is created based on the data of the evaluation values after the standardization (step S113). The data configuring the evaluation value distributions 5 are held as evaluation value distribution data in the above-described evaluation value distribution data DB 164 (see FIG. 1).

4. Update Method of Evaluation Value Distributions

Next, the update of the evaluation value distributions 5 is described. In the unit processing data obtained by implementing the recipes by the substrate processing device 200, the time-series data of a plurality of parameters are included. As described above, in the embodiment, the evaluation value distributions 5 are created for each parameter. Meanwhile, in the substrate processing device 200, the contents of the recipes may be changed. If there is a change in the contents of the recipes, before and after the change, contents of the time-series data obtained by the implementation of the recipes are different. At this time, if the abnormality judgment of the time-series data obtained after the change of the recipes is carried out using the evaluation value distributions 5 created before the change of the recipes, there is a risk that correct results cannot be obtained as the results of the abnormality judgment. Therefore, in the embodiment, when there is a change in the contents of the recipes, the update of the evaluation value distributions 5 is carried out. Furthermore, immediately after the change in the contents of the recipes, time-series data based on the contents after the change are not accumulated, and thus the update of the evaluation value distributions 5 may be carried out after the time-series data based on the contents after the change are accumulated to a certain extent.

At the time of the update of the evaluation value distributions 5, the evaluation value distribution update part 140 compares the parameters corresponding to the recipes before the change with the parameters corresponding to the recipes after the change. Then, the evaluation value distribution update part 140 creates evaluation value distributions 5 corresponding to the parameters added along with the change of the contents of the recipes based on the data of the evaluation values already accumulated (the evaluation values of the time-series data of the parameters). In addition, the specification of the parameters in which there is a change in the contents is carried out by the user, and the evaluation value distribution update part 140 recreates the evaluation value distributions 5 corresponding to the specified parameters.

For example, it is assumed that a parameter group corresponding to the recipes changes as described later due to the change of the contents of the recipes.

Before the change: parameter A, parameter B, parameter C, parameter D

After the change: parameter A, parameter C, parameter D, parameter E

Furthermore, it is assumed that for the parameter A and the parameter D, there is no change in the contents of the time series data, and for the parameter C, there is a change in contents of time series data.

Figure 12:
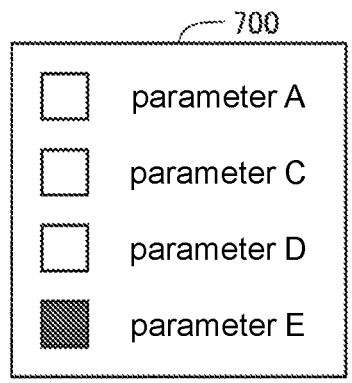
FIG. 12 is a diagram showing one example of a parameter specification screen (an example immediately after display) in the above embodiment.
Figure 13:
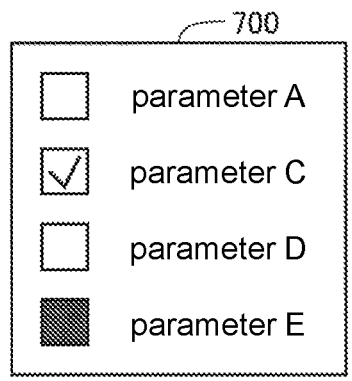
FIG. 13 is a diagram showing one example of a parameter specification screen (an example after parameter specification by a user) in the above embodiment.
Figure 14:
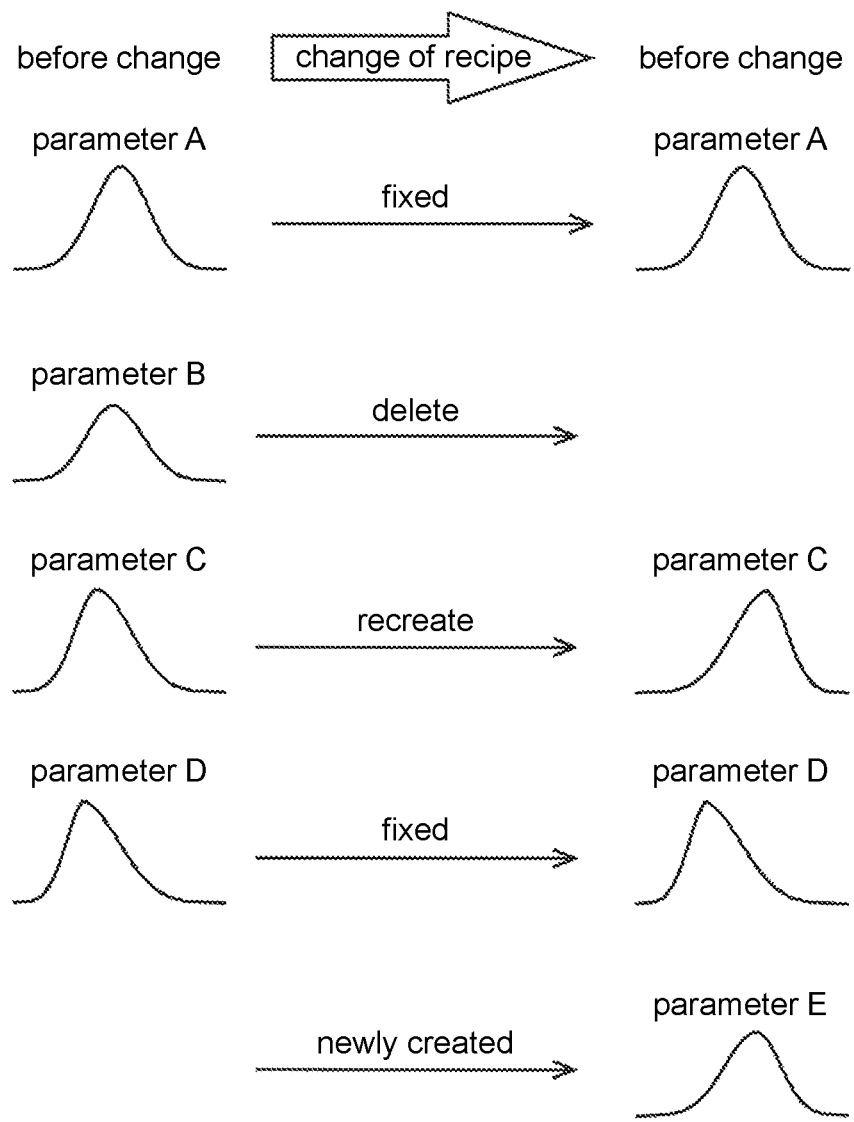
FIG. 14 is a diagram for illustrating update of the evaluation value distributions in the above embodiment.

In the case of the above example, at the time of the update of the evaluation value distributions 5, in the display part 14 of the data processing device 100, for example a parameter specification screen 700 as shown in FIG. 12 is displayed. In the parameter specification screen 700, check boxes corresponding to a parameter group after the change (the parameter A, the parameter C, the parameter D, and the parameter E) are included. The check box corresponding to the parameter E which is the parameter added along with the change of the content of the recipes is in a selected-in-advance state (a shading state in FIG. 12). In the parameter specification screen 700, because there is a change in the contents of the time-series data for the parameter C, as shown in FIG. 13, the user selects the check box corresponding to the parameter C. In this way, after the user specifies the parameter, the update of the evaluation value distributions 5 is actually carried out. As a result, the evaluation value distributions 5 are updated as schematically shown in FIG. 14. Specifically, the evaluation value distribution 5 for the parameter B which is a parameter deleted along with the change of the contents of the recipes is deleted, the evaluation value distribution 5 for the parameter E which is a parameter added along with the change of the contents of the recipes is newly created, and the evaluation value distribution 5 for the parameter C which is a parameter specified by the user is recreated. Furthermore, the evaluation value distributions 5 for the parameter A and the parameter D maintain the state before the change of the contents of the recipes.

As described above, only the evaluation value distributions 5 for the parameters relating to the change of the contents of the recipes are updated (created, recreated, or deleted). In this way, it can be prevented that the update of the evaluation value distributions 5 requires a great deal of time. Furthermore, for a specific creation procedure of the evaluation value distribution 5 after the update, the same procedure as that for creating a new evaluation value distribution 5 (see FIG. 10) can be adopted.

5. Effects

According to the embodiment, the evaluation values of each time-series datum included in the unit processing data selected by the user are calculated. Then, statistical standardization is performed on the evaluation values, and evaluation value distributions 5 showing distributions of the evaluation values after the standardization are created. If time-series data are newly generated by the implementation of the recipes under the condition that the evaluation value distributions 5 are created in the abovementioned manner, the abnormality judgment is performed based on the evaluation values of the time-series data (specifically, values after the standardization of the evaluation values obtained by the scoring). When the evaluation value distributions 5 are used in the abnormality judgment, the update of the evaluation value distributions 5 is carried out in the embodiment. Therefore, at the time of the abnormality judgment, for example a recent trend of the time series data can be taken into consideration. As described above, according to the embodiment, the abnormality detection that uses the time-series data can be carried out with sufficient accuracy taking the passage of time into consideration.

6. Variation Examples

In the following, variation examples relating to the update of the evaluation value distributions 5 are described.

6.1 First Variation Example

In the above embodiment, when there is a change in the contents of the recipes, the evaluation value distributions 5 are updated. However, the disclosure is not limited to this, and the evaluation value distributions 5 may be updated each time the scoring is performed.

Figure 15:
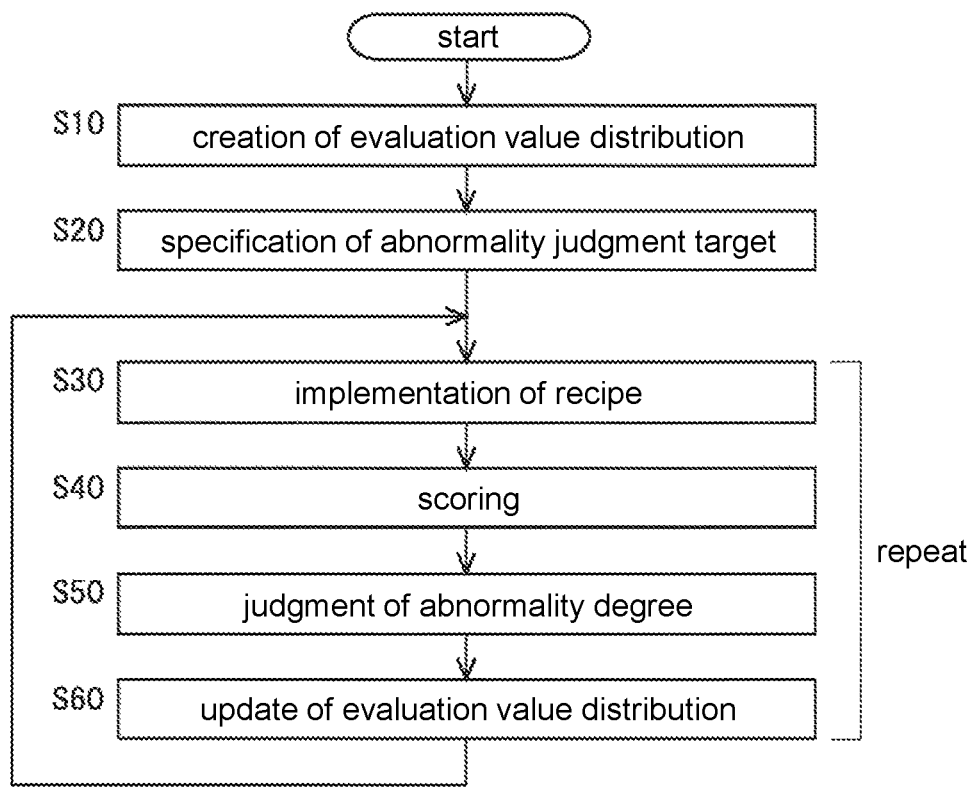
FIG. 15 is a flow chart showing an outline of an overall processing procedure of an abnormality detection that uses time-series data in a first variation example of the above embodiment.

FIG. 15 is a flow chart showing an outline of an overall processing procedure of the abnormality detection that uses the time-series data in the variation example. In the above embodiment, the processing of step S30-step S50 are repeated until there is a change in the contents of any recipe (see FIG. 7). In contrast, in the variation example, after the judgment of the abnormality degrees (step S50) is carried out based on results of the scoring (step S40), the update of the evaluation value distributions 5 (step S60) is always carried out. Furthermore, an abnormality degree judgment evaluation value calculation step is achieved by step S40.

Meanwhile, in order to create the evaluation value distributions 5, average values and standard deviations are required to be calculated based on all the unit processing data which are the creation sources. That is, in order to carry out the update of the evaluation value distributions 5 each time the scoring is performed, the average values and the standard deviations are required to be calculated each time the scoring is performed. Relating to this, if the average values and the standard deviations are calculated using all the unit processing data which are the creation sources of the evaluation value distributions 5 each time the scoring is performed, a load for the calculation becomes very large. Therefore, when the number of the unit processing data which are the creation sources of the evaluation value distributions 5 increases form n to n+1, the average values and the variances (squares of the standard deviations) may be obtained sequentially using the following equations (2)-(4).

$$\alpha = \frac{1}{n+1} \qquad (2)$$

$$\mu_{n+1} = (1-\alpha)\mu_n + \alpha x_{n+1} \qquad (3)$$

$$\sigma^2_{n+1} = (1-\alpha)\sigma^2_n + \alpha(1-\alpha)(x_{n+1} - \mu_n)^2 \qquad (4)$$

Here, $\mu_{n+1}$ represents an average value of the evaluation values in a state that the number of the unit processing data which are the creation sources of the evaluation value distributions 5 increases to n+1, $\mu_n$ represents an average value of the evaluation values in a state that the number of the unit processing data which are the creation sources of the evaluation value distributions 5 is n, $x_{n+1}$ represents an evaluation value of the unit processing data that are added, $\sigma^2_{n+1}$ represents a variance of the evaluation values in a state that the number of the unit processing data which are the creation sources of the evaluation value distributions 5 increases to n+1, and $\sigma^2_n$ represents a variance of the evaluation values in a state that the number of the unit processing data which are the creation sources of the evaluation value distributions 5 is n.

When $\mu_{n+1}$ is obtained using the above equation (3), $\mu_n$ has already been obtained; in addition, when $\sigma^2_{n+1}$ is obtained using the above equation (4), $\sigma^2_n$ has already been obtained. Therefore, the average values and the standard deviations (the standard deviations are obtained easily from the variances) for creating the evaluation value distributions 5 after the update can be obtained with a comparatively low load.

If the number of the unit processing data which are the creation sources of the evaluation value distributions 5 is small, good accuracy can not be obtained on the abnormality judgment of the time-series data. On this point, according to the variation example, because the evaluation value distributions 5 are updated each time the scoring is performed, the accuracy of the abnormality judgment is gradually improved. In addition, although it takes some time for the average values or the standard deviations to converge to a value within a certain range (sufficient accuracy is obtained on the abnormality judgment), various setting works relating to the scoring or the creation the evaluation value distributions 5 can be carried out in advance even under the condition that no unit processing data as implementation results of the recipes is obtained.

6.2 Second Variation Example

In the above embodiment, the evaluation value distributions 5 are created or updated based on the unit processing data arbitrarily selected by the user. However, the disclosure is not limited to this, and the evaluation value distributions 5 may be updated based on the unit processing data obtained by the processing in the specified processing units 222.

Figure 16:
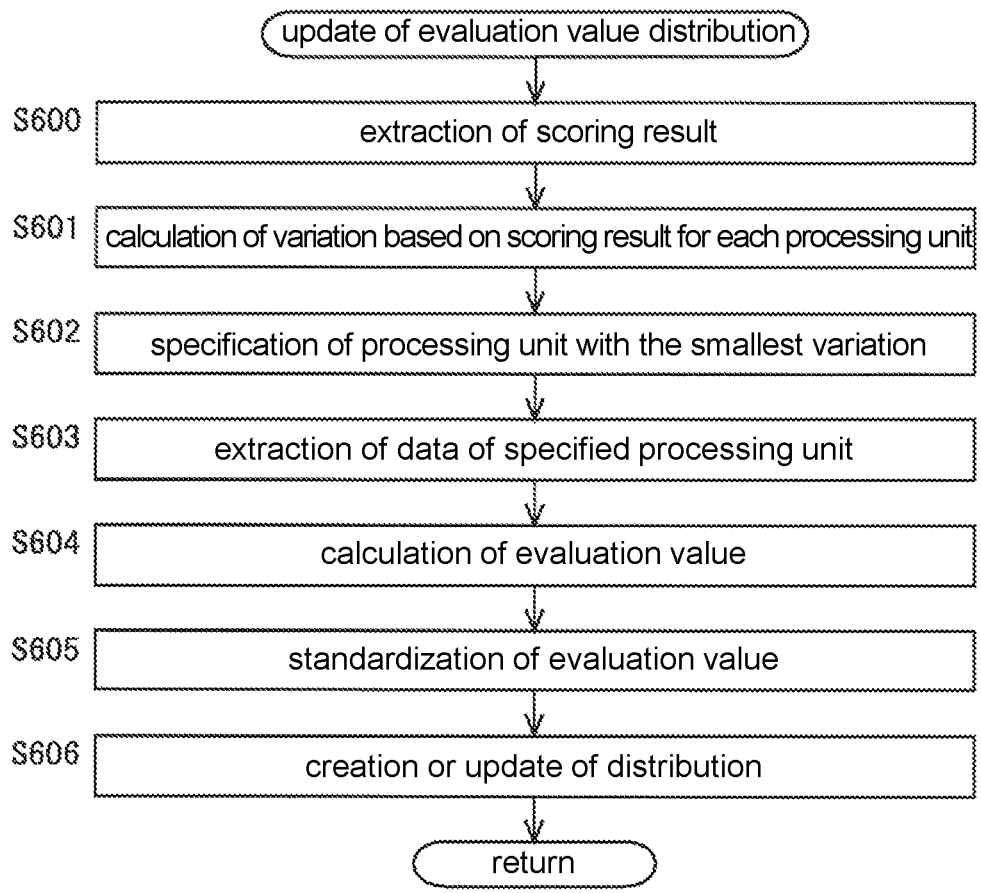
FIG. 16 is a flow chart showing a specific procedure of update of evaluation value distributions in a second variation example of the above embodiment.

FIG. 16 is a flow chart showing a specific procedure of the update of the evaluation value distributions 5 in the variation example. In the variation example, when the evaluation value distributions 5 are updated, at first, scoring results (data of the evaluation values) are extracted (step S600). In step S600, for example, the scoring results for 1000 unit processing data obtained most recently for one evaluation value distribution 5 are extracted.

Figure 17:
FIG. 17 is a diagram for illustrating creation of distributions of evaluation values for each processing unit in the second variation example of the above embodiment.

Next, based on the scoring results extracted in step S600, variations (variances or standard deviations) of the evaluation values are calculated for each processing unit 222 (step S601). Furthermore, at this time, data of the evaluation values are not standardized. Meanwhile, if distributions (distributions of the evaluation values) are created based on the scoring results extracted in step S600, the distributions are, as schematically shown in FIG. 17 for example, different for each processing unit. Here, it is usually considered that, as the processing units 222 include more time-series data with high abnormality degrees in output results, the variations based on the above distributions become greater. Therefore, as described above, the variations of the evaluation values are calculated for each processing unit 222 in step S601. Then, the processing unit 222 is specified in which the smallest variation among the variations calculated in step S601 is obtained (step S602).

After that, the unit processing data obtained by the processing in the processing units 222 specified in step S602 are extracted, for example, from the 1000 unit processing data obtained most recently (step S603). Then, for each time-series datum included in the unit processing data extracted in step S603 (referred to as "extracted unit processing data" hereinafter), the evaluation values are calculated (step S604), and the evaluation values calculated in step S604 are standardized (step S605). Furthermore, the evaluation values are also standardized using the above equation (1) in step S605. At last, for each parameter (that is, each type of the time-series data), the evaluation value distribution 5 after the update is created based on the data of the evaluation values after the standardization (step S606).

Furthermore, in the variation example, a variation calculation step is achieved by step S601, a processing unit specification step is achieved by step S602, a unit processing data extraction step is achieved by step S603, an distribution update evaluation value calculation step is achieved by step S604, and an evaluation value distribution creation step is achieved by step S605 and step S606.

According to the variation example, even when the unit processing data which are the creation sources of the evaluation value distributions 5 are hard to be selected, the processing units 222 in which it is considered that stable processing is carried out are selected (specified) based on the scoring results of each processing unit 222. Then, the evaluation value distribution 5 after the update is created based on the unit processing data obtained by the processing of the selected processing units 222. Therefore, the abnormality judgment in which the evaluation value distributions 5 are used has a high accuracy. As described above, according to the variation example, even when the unit processing data which are the creation sources of the evaluation value distributions 5 are hard to be selected, the evaluation value distributions 5 are updated so that the abnormality judgment of the time-series data can be carried out with high accuracy.

Figure 18:
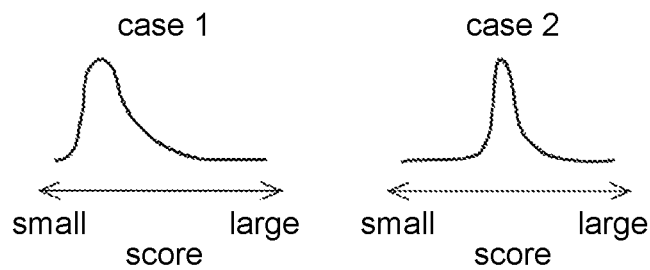
FIG. 18 is a diagram for illustrating that the evaluation values are considered in addition to variations in the second variation example of the above embodiment.

Furthermore, in the above example, the specification of the processing units 222 in step S602 is carried out only considering the variations of the evaluation values. Relating to this, as shown in FIG. 18 for example, it is also considered that there is a case in which the variations of the distributions corresponding to processing units that include many time-series data with comparatively higher abnormality degrees are smaller than the variations of the distributions corresponding to processing units that include many time-series data with comparatively lower abnormality degrees. Therefore, for example, in the above step S601 (see FIG. 16), the average values of the evaluation values may be calculated in addition to the variations of the evaluation values, and in step S602, the specification of the processing units 222 may be carried out considering both the variations of the evaluation values and the average values of the evaluation values. In this case, a statistical value calculation step is achieved by step S601.

6.3 Third Variation Example

In the above embodiment, the evaluation value distributions 5 after the update are created by the same procedure (see FIG. 10) when the evaluation value distributions 5 are newly created. However, the disclosure is not limited to this, and the evaluation value distributions 5 after the update may also be determined using AI (artificial intelligence) technique. Therefore, in the following, a way to use AI technique in the update of the evaluation value distributions 5 is described with reference to FIG. 19-FIG. 21. Furthermore, it is assumed that in the variation example, evaluation value distributions 5 common to all the processing units 222 are prepared for each parameter. In addition, in the following, the evaluation value distribution 5 for one parameter is paid attention to.

Figure 19:
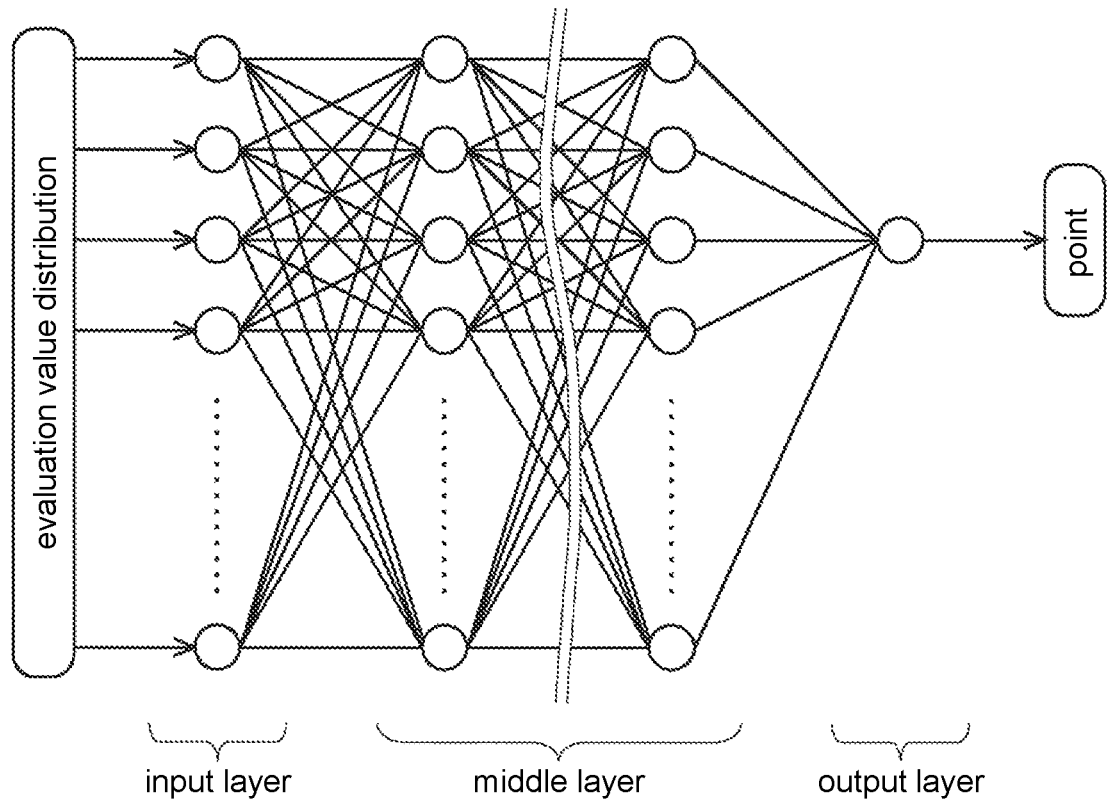
FIG. 19 is a diagram showing one example of a neural network prepared as a learner in a third variation example of the above embodiment.

In the variation example, a neural network as shown in FIG. 19 for example, which is configured by an input layer, a middle layer and an output layer, is prepared as a learner. A layer number of the middle layer is not limited; in addition, the unit number of a certain layer may be different from the unit number of another layer in a plurality of middle layers. The unit number of the input layer is not particularly limited as long as the data of the evaluation value distributions 5 can be input appropriately. Furthermore, as the type of the neural network, for example, a general feed-forward neural network or a convolution neural network can be adopted.

Figure 20:
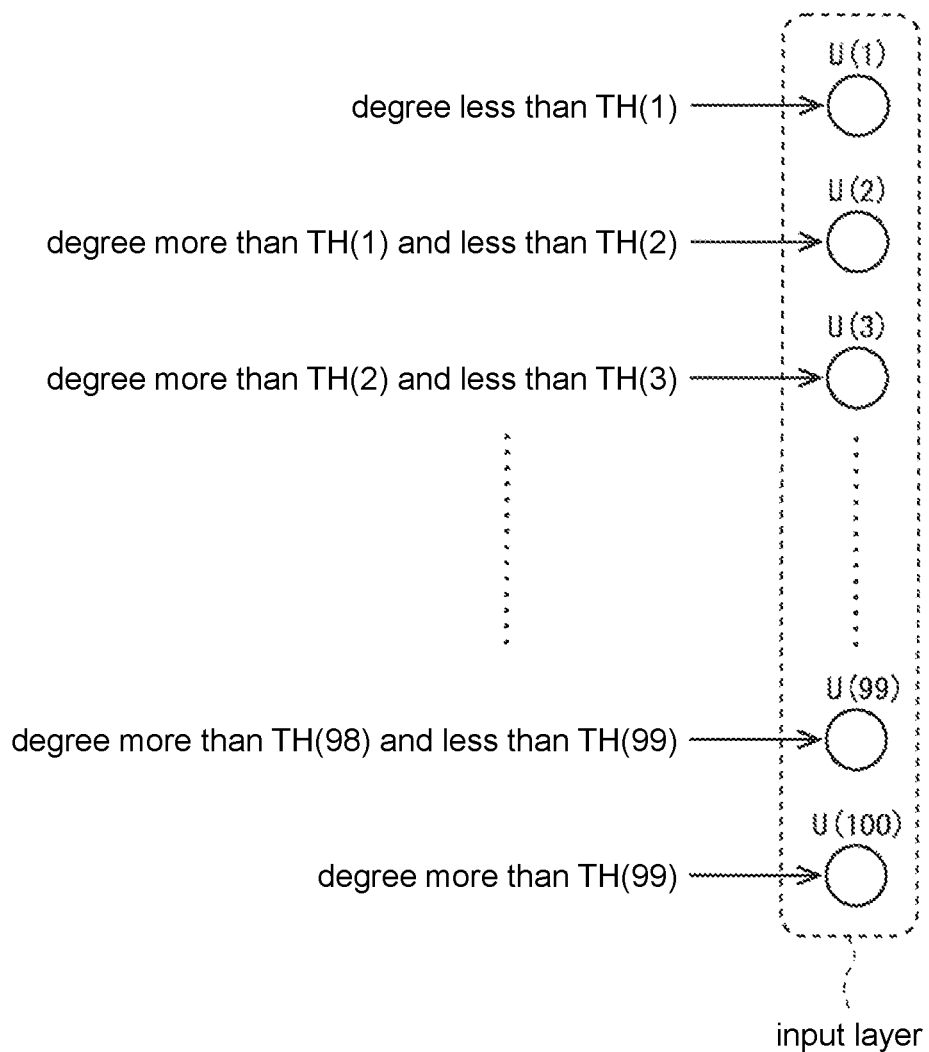
FIG. 20 is a diagram for illustrating data input to an input layer of the neural network in the third variation example of the above embodiment.

As shown in FIG. 19, the data of the evaluation value distributions 5 are input to the input layer, and data of points are output from the output layer. For example, when the input layer is configured by 100 units U(1)-U(100) as shown in FIG. 20, 99 threshold values TH(1)-TH(99) are set to divide a range in which the evaluation value can be obtained into 100 ranges. Furthermore, these threshold values TH(1)-TH(99) satisfy a relationship of "TH(1)<TH(2)< TH(3)< ... <TH(99)". Under such a premise, when the data of one evaluation value distribution 5 are input to the input layer, for example, a degree of a value less than the threshold value TH(1) (a value as an evaluation value) is input to the first unit U(1), and a degree of a value more than the threshold value TH(1) and less than the threshold value TH(2) is input to the second unit U(2) (see FIG. 20). If the data of the evaluation value distributions 5 are input to the input layer as described above, feed-forward propagation of the data is carried out based on a value of weight or bias in the neural network at that time, and the data of the points are output from the output layer.

Figure 21:
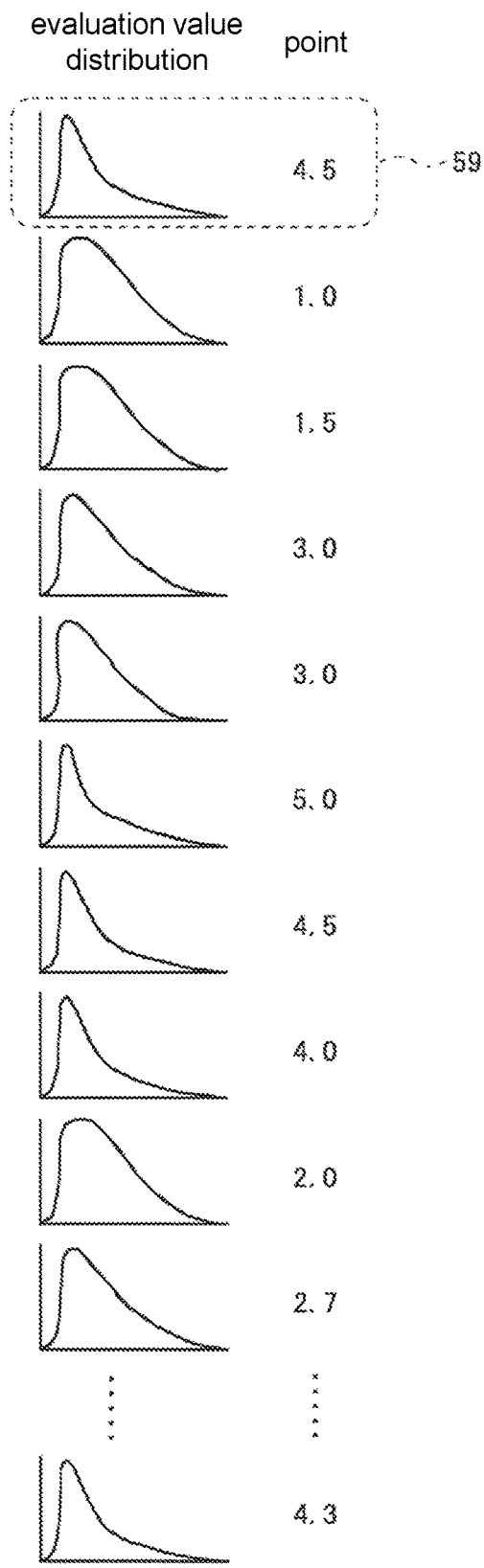
FIG. 21 is a diagram for illustrating learning data in the third variation example of the above embodiment.

Under the condition that the neural network as described above is prepared as the learner, learning of the neural network is required to be carried out before the evaluation value distributions 5 are actually updated. In the variation example, many learning data as schematically shown in FIG. 21 respectively including the evaluation value distributions 5 and the points as teacher data are prepared for the learning of the neural network. Furthermore, the data of the part shown by a symbol 59 in FIG. 21 are equivalent to one learning datum. For example, the points more than 0 and less than 5 are assigned to each evaluation value distribution 5.

At the time of learning, for each learning datum, a square error of the point (the point output from the output layer) obtained by giving the data of the evaluation value distribution 5 to the input layer and the point as the teacher data are obtained. Then, in order to minimize a sum of the square errors of all the learning data by an error back propagation method, the value of the weight or the bias in the neural network is obtained.

At the time of the update of the evaluation value distributions 5, the neural network in which the learning is carried out in advance as described above is used. Specifically, the evaluation value distributions 5 after the update are set by the following procedure using the neural network in which the learning is completed.

At first, for each processing unit 222, for example, the evaluation value distributions 5 are created using the latest 1000 time-series data of the most recently obtained parameters. In this way, if the number of the processing units 222 is 12, 12 evaluation value distributions 5 are created. Then, data of the 12 evaluation value distributions 5 respectively corresponding to the 12 processing units 222 are input to the input layer of the neural network in turn. As a result, data of 12 points are output from the output layer of the neural network in turn. In the variation example, the evaluation value distribution 5 which obtains the highest point (the best point) among the 12 points is determined as the evaluation value distribution 5 after update.

As described above, in the variation example, a plurality of evaluation value distributions 5 corresponding to the plurality of processing units 222 is input to the neural network (the learner) in which the learning is carried out in advance using a plurality of learning data respectively including the evaluation value distributions 5 and the points as the teacher data, and the evaluation value distribution 5 in which the point output from the neural network is the best among the plurality of evaluation value distributions 5 is determined as the evaluation value distribution 5 after update.

According to the variation example, at the time of the update of the evaluation value distributions 5, the evaluation value distributions 5 are created based on the newest time-series data for each processing unit 222. Then, the evaluation value distribution 5 which is determined to be the best by the AI technique from the plurality of evaluation value distributions 5 is determined as the evaluation value distribution 5 after update. Therefore, the abnormality judgment in which the evaluation value distribution 5 after update is used has a high accuracy. As described above, according to the variation example, similar to the second variation example, even if the unit processing data which are the creation sources of the evaluation value distributions 5 are hard to be selected, the evaluation value distributions 5 are updated so that the abnormality judgment of the time-series data can be carried out with high accuracy.

7. Alternatives

In the above, the disclosure is specifically described, but the above description is illustrative in all aspects and is not limitative. It is understood that numerous other changes or variations can be devised without departing from the range of the disclosure.

What is claimed is:

1. A data processing method, in which a plurality of types of time-series data obtained by unit processing is taken as unit processing data and a plurality of unit processing data is processed, the plurality of types of time-series data being obtained by a sensor, the plurality of unit processing data being data obtained by implementing recipes by a substrate processing device, the method comprising:

an evaluation value distribution utilization step, in which processing that uses evaluation value distributions showing appearance frequency of each value of evaluation values obtained by evaluating each time-series datum is carried out with a computer; and an evaluation value distribution update step, in which when there is a change in contents of the recipes, evaluation value distributions corresponding to parameters with the change in the contents are created with the computer and the evaluation value distributions are updated with the computer such that the created evaluation value distributions become evaluation value distributions after update corresponding to the recipes, wherein the evaluation value distribution utilization step includes
an abnormality degree judgment evaluation value calculation step, in which the evaluation values of the time-series data included in unit processing data newly obtained are calculated; and
an abnormality degree judgment step, in which judgment of abnormality degrees of the time-series data included in the unit processing data newly obtained is carried out based on the evaluation value distributions and the evaluation values calculated in the abnormality degree judgment evaluation value calculation step.

2. The data processing method according to claim 1, wherein the plurality of types of time-series data are time-series data of a plurality of parameters;
the evaluation value distributions are set for each of the plurality of parameters; and
in the evaluation value distribution update step, only the evaluation value distributions corresponding to the parameters with the change in the content are updated.

3. The data processing method according to claim 1, wherein in the evaluation value distribution update step, the evaluation value distributions corresponding to the parameters added along with the change of the contents of the recipes are created based on data of the evaluation values already accumulated.

4. The data processing method according to claim 1, wherein in the evaluation value distribution update step, the evaluation value distributions corresponding to the parameters specified from outside are recreated.

5. The data processing method according to claim 1, wherein the evaluation value distribution update step is implemented each time the abnormality degree judgment evaluation value calculation step is implemented.

6. The data processing method according to claim 1, wherein
the unit processing is implemented as one recipe on one piece of substrate by a substrate processing device having a plurality of processing units;
the evaluation value distribution update step comprises:
a variation calculation step, in which variations of the evaluation values are calculated for each processing unit based on the evaluation values of each time-series datum;
a processing unit specification step, in which the processing unit is specified in which the smallest variation among the variations calculated in the variation calculation step is obtained;
a unit processing data extraction step, in which unit processing data corresponding to the processing unit specified in the processing unit specification step are extracted from the plurality of unit processing data;
a distribution update evaluation value calculation step, in which the evaluation values of each time-series datum included in extracted unit processing data which are the unit processing data extracted in the unit processing data extraction step are calculated; and
an evaluation value distribution creation step, in which an evaluation value distribution after update is created for each type of the time-series data based on the evaluation values of each time-series datum calculated in the distribution update evaluation value calculation step.

7. The data processing method according to claim 1, wherein
the unit processing is implemented as one recipe on one piece of substrate by a substrate processing device having a plurality of processing units;
the evaluation value distribution update step comprises:
a statistical value calculation step, in which average values and variations of the evaluation values are calculated for each processing unit based on the evaluation values of each time-series datum;
a processing unit specification step, in which the processing unit is specified considering the average values and the variations calculated in the statistical value calculation step;
a unit processing data extraction step, in which the unit processing data corresponding to the processing unit specified in the processing unit specification step are extracted from the plurality of unit processing data;
a distribution update evaluation value calculation step, in which the evaluation values of each time-series datum included in extracted unit processing data which are the unit processing data extracted in the unit processing data extraction step are calculated; and
an evaluation value distribution creation step, in which an evaluation value distribution after update is created for each type of the time-series data based on the evaluation values of each time-series datum calculated in the distribution update evaluation value calculation step.

8. The data processing method according to claim 1, wherein
the unit processing is implemented as one recipe on one piece of substrate by a substrate processing device having a plurality of processing units; and
in the evaluation value distribution update step, a plurality of evaluation value distributions corresponding to the plurality of processing units is input to a learner in which learning is carried out in advance using a plurality of learning data respectively including evaluation value distributions and points as teacher data, and an evaluation value distribution for which a point output from the learner is the best among the plurality of evaluation value distributions is determined as an evaluation value distribution after update.

9. The data processing method according to claim 8, wherein the evaluation value distribution input to the learner in the evaluation value distribution update step is an evaluation value distribution created based on the evaluation values of the time-series data obtained by implementation of a most recent recipe.

10. A data processing device, which takes a plurality of types of time-series data obtained by unit processing as unit processing data and processes a plurality of unit processing data, the plurality of types of time-series data being obtained by a sensor, the plurality of unit processing data being data obtained by implementing recipes by a substrate processing device, the data processing device comprising:
an evaluation value distribution utilization part, which carries out processing that uses evaluation value distributions showing appearance frequency of each value of evaluation values obtained by evaluating each time-series datum with a computer; and
an evaluation value distribution update part, which when there is a change in contents of the recipes, the evaluation value distribution update part performed by the computer creates evaluation value distributions corresponding to parameters with the change in the contents and updates the evaluation value distributions such that the created evaluation value distributions become evaluation value distributions after update corresponding to the recipes,
wherein the evaluation value distribution utilization part includes
an abnormality degree judgment evaluation value calculation part, in which the evaluation values of the time-series data included in unit processing data newly obtained are calculated; and
an abnormality degree judgment part, in which judgment of abnormality degrees of the time-series data included in the unit processing data newly obtained is carried out based on the evaluation value distributions and the evaluation values calculated in the abnormality degree judgment evaluation value calculation part.

11. A non-transitory computer-readable recording medium, in which a data processing program is stored to make a computer that is included in a data processing device that takes a plurality of types of time-series data obtained by unit processing as unit processing data and processes a plurality of unit processing data, the plurality of types of time-series data being obtained by a sensor and the plurality of unit processing data being data obtained by implementing recipes by a substrate processing device, to implement an evaluation value distribution utilization step, in which processing that uses evaluation value distributions showing appearance frequency of each value of evaluation values obtained by evaluating each time-series datum is carried out; and an evaluation value distribution update step, in which when there is a change in contents of the recipes, evaluation value distributions corresponding to parameters with the change in the contents are created and the evaluation value distributions are updated with the computer such that the created evaluation value distributions become evaluation value distributions after update corresponding to the recipes, wherein, the evaluation value distribution utilization step includes an abnormality degree judgment evaluation value calculation step, in which the evaluation values of the time-series data included in unit processing data newly obtained are calculated; and an abnormality degree judgment step, in which judgment of abnormality degrees of the time-series data included in the unit processing data newly obtained is carried out based on the evaluation value distributions and the evaluation values calculated in the abnormality degree judgment evaluation value calculation step.

12. A data processing method, in which a plurality of types of time-series data obtained by unit processing is taken as unit processing data and a plurality of unit processing data is processed, the plurality of types of time-series data being obtained by a sensor, the plurality of unit processing data being data obtained by implementing recipes by a substrate processing device, the method comprising:

an evaluation value distribution utilization step, in which processing that uses evaluation value distributions showing appearance frequency of each value of evaluation values obtained by evaluating each time-series datum is carried out with a computer; and an evaluation value distribution update step, in which when there is a change in contents of the recipes, evaluation value distributions corresponding to parameters with the change in the contents are created with the computer and the evaluation value distributions are updated with the computer such that the created evaluation value distributions become evaluation value distributions after update corresponding to the recipes, wherein the evaluation value distribution utilization step includes an abnormality degree judgment evaluation value calculation step, in which the evaluation values of the time-series data included in unit processing data newly obtained are calculated; and an abnormality degree judgment step, in which judgment of abnormality degrees of the time-series data included in the unit processing data newly obtained is carried out based on the evaluation value distributions and the evaluation values calculated in the abnormality degree judgment evaluation value calculation step, the unit processing is implemented as one recipe on one piece of substrate by the substrate processing device having a plurality of processing units;

in the evaluation value distribution update step, a plurality of evaluation value distributions corresponding to the plurality of processing units is input to a learner in which learning is carried out in advance using a plurality of learning data respectively including evaluation value distributions and points as teacher data, and an evaluation value distribution for which a point output from the learner is the best among the plurality of evaluation value distributions is determined as an evaluation value distribution after update;

the learner is a neural network having an input layer including a plurality of units, a middle layer including a plurality of units and an output layer including one unit;

the units of the input layer correspond respectively to ranges obtained by dividing a range in which values as the evaluation values can be obtained by predetermined threshold values; and appearance frequency of the values included in the ranges corresponding to each unit are input to each unit of the input layer.

13. A data processing device, which takes a plurality of types of time-series data obtained by unit processing as unit processing data and processes a plurality of unit processing data, the plurality of types of time-series data being obtained by a sensor, the plurality of unit processing data being data obtained by implementing recipes by a substrate processing device, the data processing device comprising:

an evaluation value distribution utilization part, which carries out processing that uses evaluation value distributions showing appearance frequency of each value of evaluation values obtained by evaluating each time-series datum with a computer; and an evaluation value distribution update part, which when there is a change in contents of the recipes, the evaluation value distribution update part performed by the computer to create evaluation value distributions corresponding to parameters with the change, in the contents and updates the evaluation value distributions such that the created evaluation value distributions become evaluation value distributions after update corresponding to the recipes, the evaluation value distribution utilization part includes an abnormality degree judgment evaluation value calculation part, in which the evaluation values of the time-series data included in unit processing data newly obtained are calculated; and an abnormality degree judgment part, in which judgment of abnormality degrees of the time-series data included in the unit processing data newly obtained is carried out based on the evaluation value distributions and the evaluation values calculated in the abnormality degree judgment evaluation value calculation part, the unit processing is implemented as one recipe on one piece of substrate by the substrate processing device having a plurality of processing units;

in the evaluation value distribution update part, a plurality of evaluation value distributions corresponding to the plurality of processing units is input to a learner in which learning is carried out in advance using a plurality of learning data respectively including evaluation value distributions and points as teacher data, and an evaluation value distribution for which a point output from the learner is the best among the plurality of evaluation value distributions is determined as an evaluation value distribution after update;

the learner is a neural network having an input layer including a plurality of units, a middle layer including a plurality of units and an output layer including one unit;

the units of the input layer correspond respectively to ranges obtained by dividing a range in which values as the evaluation values can be obtained by predetermined threshold values; and appearance frequency of the values included in the ranges corresponding to each unit are input to each unit of the input layer.

14. A non-transitory computer-readable recording medium, in which a data processing program is stored to make a computer that is included in a data processing device that takes a plurality of types of time-series data obtained by unit processing as unit processing data and processes a plurality of unit processing data, the plurality of types of time-series data being obtained by a sensor and the plurality of unit processing data being data obtained by implementing recipes by a substrate processing device, to implement an evaluation value distribution utilization step, in which processing that uses evaluation value distributions showing appearance frequency of each value of evaluation values obtained by evaluating each time-series datum is carried out; and an evaluation value distribution update step, in which when there is a change in contents of the recipes, evaluation value distributions corresponding to parameters with the change in the contents are created with the computer and the evaluation value distributions are updated such that the created evaluation value distributions become evaluation value distributions after update corresponding to the recipes, wherein the evaluation value distribution utilization step includes
an abnormality degree judgment evaluation value calculation step, in which the evaluation values of the time-series data included in unit processing data newly obtained are calculated; and an abnormality degree judgment step, in which judgment of abnormality degrees of the time-series data included in the unit processing data newly obtained is carried out based on the evaluation value distributions and the evaluation values calculated in the abnormality degree judgment evaluation value calculation step, the unit processing is implemented as one recipe on one piece of substrate by the substrate processing device having a plurality of processing units;

in the evaluation value distribution update step, a plurality of evaluation value distributions corresponding to the plurality of processing units is input to a learner in which learning is carried out in advance using a plurality of learning data respectively including evaluation value distributions and points as teacher data, and an evaluation value distribution for which a point output from the learner is the best among the plurality of evaluation value distributions is determined as an evaluation value distribution after update;

the learner is a neural network having an input layer including a plurality of units, a middle layer including a plurality of units and an output layer including one unit;

the units of the input layer correspond respectively to ranges obtained by dividing a range in which values as the evaluation values can be obtained by predetermined threshold values; and appearance frequency of the values included in the ranges corresponding to each unit are input to each unit of the input layer.

* * * * *